United States Patent
Nogami

(10) Patent No.: US 7,541,812 B2
(45) Date of Patent: Jun. 2, 2009

(54) MRI APPARATUS, NMR ANALYZER, AND GANTRY

(75) Inventor: Kazuto Nogami, Nasushiobara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 12/010,959

(22) Filed: Jan. 31, 2008

(65) Prior Publication Data
US 2008/0191698 A1  Aug. 14, 2008

(30) Foreign Application Priority Data
Feb. 13, 2007  (JP) ............................. 2007-031875
Nov. 20, 2007  (JP) ............................. 2007-300458

(51) Int. Cl.
*G01V 3/00* (2006.01)

(52) U.S. Cl. ...................................... 324/319; 324/318

(58) Field of Classification Search ......... 324/300–322; 600/407–445
See application file for complete search history.

(56) References Cited

U.S. PATENT DOCUMENTS
5,532,597 A     7/1996  McGinley et al.
2008/0169813 A1*  7/2008  Yamashita et al. .......... 324/321

FOREIGN PATENT DOCUMENTS
JP    8-299304    11/1996
JP    2006-218141    8/2006

* cited by examiner

*Primary Examiner*—Brij B Shrivastav
(74) *Attorney, Agent, or Firm*—Nixon & Vanderhye PC

(57) ABSTRACT

A magnetic resonance imaging apparatus includes a static magnetic field generating unit, a main coil (gradient magnetic coil), a radio frequency coil, and a shimming structure unit. The shimming structure unit includes first iron shims and second iron shims. The first iron shims are disposed between the main coil and a shield coil of the gradient magnetic coil and disposed in a central axial center of the static magnetic field generating unit. The second iron shims are disposed on an outer side of the main coil and the shield coil and disposed on a central axial end of the static magnetic field generating unit.

25 Claims, 6 Drawing Sheets

MRI APPARATUS, NMR ANALYZER, AND GANTRY

CROSS-REFERENCE TO RELATED APPLICATIONS

This application is based upon and claims the benefit of priority from the prior Japanese Patent Application No. 2007-031875, filed on Feb. 13, 2007 and the prior Japanese Patent Application No. 2007-300458, filed on Nov. 20, 2007; the entire contents of which are incorporated herein by reference.

BACKGROUND OF THE INVENTION

1. Field of the Invention

The present invention relates to a gantry for use in a magnetic resonance imaging (MRI) apparatus, or a nuclear magnetic resonance (NMR) analyzer.

2. Description of the Related Art

MRI apparatuses and NMR analyzers include a static magnetic field generating section to generate a static magnetic field, which generates a magnetic resonance signal, through quantization of nuclear magnetism. Such a static magnetic field generating section includes a static magnetic field generating unit and a shimming unit. The static magnetic field generating unit generates the static magnetic field. The shimming unit adjusts uniformity of the static magnetic field.

FIG. 7 is a schematic for explaining a static magnetic field generated by a static magnetic field generating unit 10A. The length of the static magnetic field generating unit 10A in the axial direction thereof is relatively longer. The static magnetic field generating unit 10A is formed from a superconducting magnet. Moreover, the static magnetic field generating unit 10A includes a superconducting coil 12A accommodated within a roughly cylindrical vacuum chamber that is filled with a refrigerant. The vacuum chamber has a bore, i.e., a hollow space, in its central portion. A magnetic field (static magnetic field), indicated by dashed lines in FIG. 7, is generated within the bore. Because the static magnetic field is a key factor in an MRI operation and an NMR analysis operation, it is necessary that the static magnetic field is uniform as much as possible. Specifically, it is necessary that the static magnetic field within the imaging area indicated by the dashed-dotted line in FIG. 7 is highly uniform. If the static magnetic field within the imaging area is non-uniform, it is corrected so that the degree of uniformity is less than or equal to several parts-per-million.

A technology called shimming (passive shim) is known in the art as a technology for correcting non-uniformity of the static magnetic field. In the shimming technology, a magnetic field is adjusted by placing several pieces of iron (iron shims) in an appropriate position in the bore. Specifically, a shimming structure actualizing the shimming technology includes, for example, shim trays (not shown) arranged within the bore. A plurality of pockets is formed at different locations on each of the shim trays. An appropriate number of iron shims are placed in an appropriate pocket to make the static magnetic field in the bore uniform. This configuration enables placement of an appropriate number of iron shims in appropriate positions. For details, refer to, for example, JP-A H8-299304 (KOKAI).

FIG. 8 is a schematic for explaining a static magnetic field generated by a static magnetic field generating unit 10B which is seen in recent years and it is relatively short in the axial direction thereof. A trend can be seen in recent years to shorten an axial length of the MRI apparatus to reduce a sensation of being surrounded experienced by a patient (test subject). The static magnetic field generated by the static magnetic field generating unit 10A and 10B composed of the superconducting magnet is significantly disturbed near ends of the static magnetic field generating units 10A and 10B in the axial direction, as shown in FIG. 7 and FIG. 8. Such a disturbance is caused by influence from the superconducting coils 12A and 12B. In the static magnetic field generating unit 10A, which is relatively longer in the axial direction, as shown in FIG. 7, the imaging area is away from positions at which the disturbance occurs. Therefore, the static magnetic field in the imaging area is less affected due to the disturbance so that the non-uniformity of the static magnetic field can be corrected with a small number of iron shims. However, in the static magnetic field generating unit 10B, which is relatively shorter in the axial direction, as shown in FIG. 8, a distance between the superconducting coil 12B and the imaging area indicated by the dashed-dotted line is short. Therefore, the static magnetic field in the imaging area is significantly affected due to the disturbance so that a large number of iron shims are required to achieve uniformity in the static magnetic field.

However, when a large number of iron shims are used as described above, a secondary problem occurs, such as that described below. Magnetic susceptibility of iron changes with temperature. The magnetic susceptibility decreases when the temperature rises. The iron shims are generally disposed near a gradient magnetic coil. Therefore, the iron shims may be heated up due to the temperature generated in the gradient magnetic coil during an MRI operation. When the iron shims are heated in this way, the iron shims do not perform the desired correction so that the uniformity of the static magnetic field deteriorates. As a result, the MRI imaging operation, or the NMR analysis operation, cannot be successfully performed.

Also, a large amount of stress is applied when a large number of iron shims are used because of influence of the magnetic field. As a result, adhered iron shims may come loose. Moreover, for example, the shim trays, in which the iron shims are placed, may become damaged, or the apparatus may become slightly deformed.

SUMMARY OF THE INVENTION

According to an aspect of the present invention, there is provided a magnetic resonance imaging apparatus that includes a static magnetic field generating unit that generates a static magnetic field within a bore; a gradient magnetic coil that applies a gradient magnetic field to a test subject arranged in the static magnetic field; a radio frequency coil that receives a magnetic resonance signal from the test subject to which the gradient magnetic field is applied; and a shimming structure unit that adjusts static magnetic field uniformity. The shimming structure unit includes a first magnetic member disposed between a main coil and a shield coil of the gradient magnetic coil and disposed in a central axial center of the static magnetic field; and a second magnetic member disposed on an outer side of the main coil and the shield coil and disposed on a central axial end of the static magnetic field generating unit.

According to another aspect of the present invention, there is provided a nuclear magnetic resonance analyzer including a static magnetic field generating unit that generates a static magnetic field within a bore; a gradient magnetic coil that applies a gradient magnetic field to a sample for analysis arranged in the static magnetic field; a radio frequency coil that receives a magnetic resonance signal from the sample to which the gradient magnetic field is applied; and a shimming structure unit that adjusts static magnetic field uniformity. The shimming structure unit includes a first magnetic member disposed between a main coil and a shield coil of the gradient magnetic coil and disposed in a central axial center of the static magnetic field; and a second magnetic member disposed on an outer side of the main coil and the shield coil and disposed on a central axial end of the static magnetic field generating unit.

According to still another aspect of the present invention, there is provided a gantry including a static magnetic field generating unit that generates a static magnetic field within a bore; and a shimming structure unit that adjusts static magnetic field uniformity. The shimming structure unit includes a first magnetic member disposed between a main coil and a shield coil of the gradient magnetic coil, which applies a gradient magnetic field to a test subject or a sample for analysis arranged in the static magnetic field, and disposed in a central axial center of the static magnetic field; and a second magnetic member disposed on an outer side of the main coil and the shield coil and disposed on a central axial end of the static magnetic field generating unit.

DETAILED DESCRIPTION OF THE INVENTION

Exemplary embodiments of the present invention are described below with reference to the attached drawings. The invention is not limited to these embodiments.

According to an embodiment, iron shims conventionally arranged in large numbers on axial ends within the bore are not disposed. In place of iron shims used to correct a static magnetic field of the axial ends within the bore, other iron shims are disposed on both ends of the static magnetic field generating unit outside of the bore.

Figure 1:
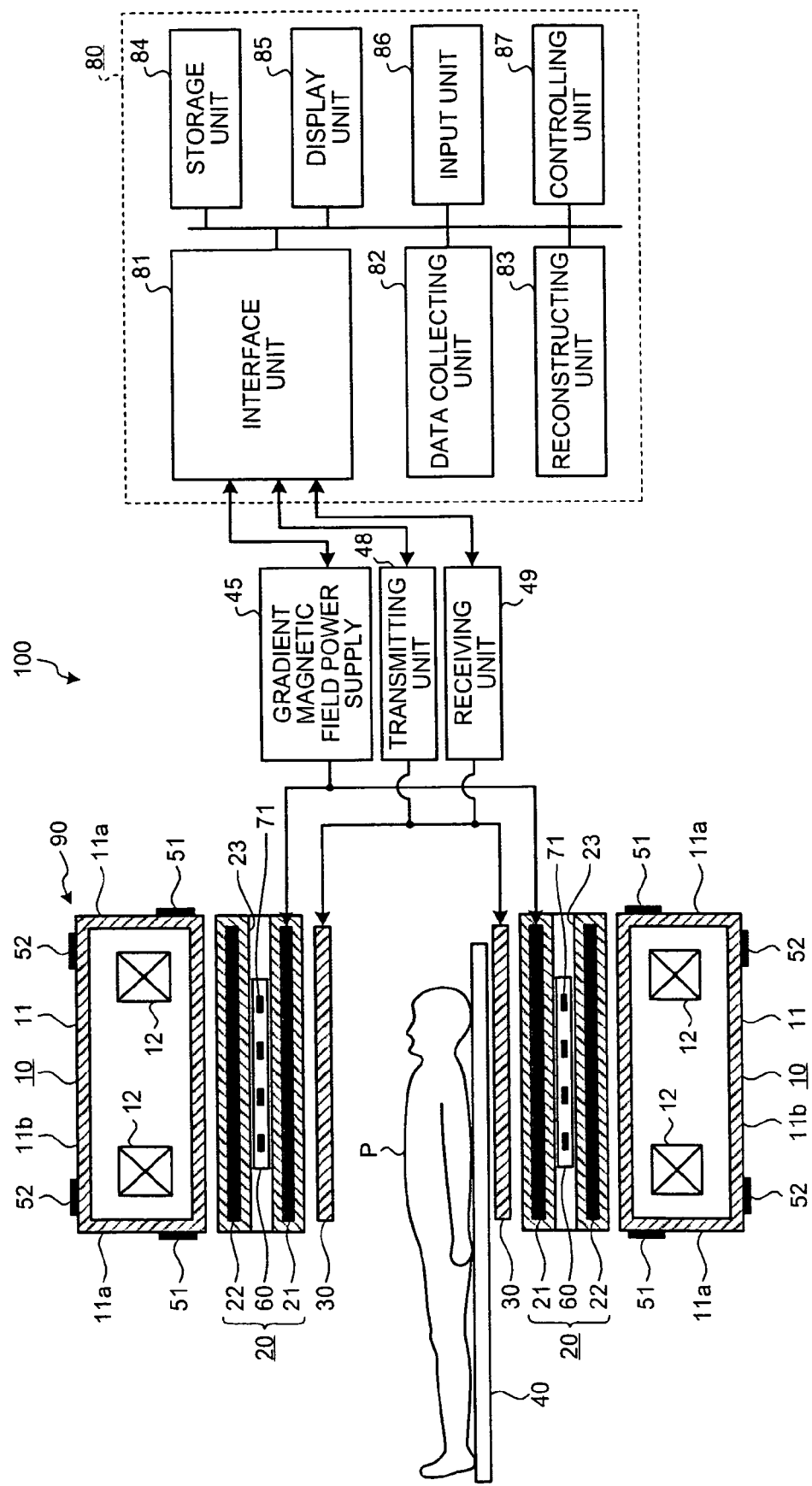
FIG. 1 is a schematic for explaining the configuration of an MRI apparatus according to an embodiment of the present invention.

FIG. 1 is a schematic for explaining the configuration of an MRI apparatus 100 according to an embodiment of the present invention. The MRI apparatus 100 includes a gantry 90, a patient couch top 40, a gradient magnetic field power supply 45, a transmitting unit 48, a receiving unit 49, and an operator console 80. The patient couch top 40 is provided on a patient couch (not shown). The gantry 90 includes a static magnetic field generating unit 10, a gradient magnetic coil structure 20, and a radio frequency coil 30.

The static magnetic field generating unit 10 includes a thick, roughly cylindrical vacuum chamber 11 and a superconducting coil 12 accommodated within the vacuum chamber 11. The vacuum chamber 11 is filled with a refrigerant so that the superconducting coil 12 is immersed in the refrigerant. The superconducting coil 12 generates a strong magnetic field on both axial ends of the vacuum chamber 11. The static magnetic field generating unit 10 generates a static magnetic field within a bore (space within the vacuum chamber 11 of the static magnetic field generating unit 10). Iron shims 51 and 52, which form a second magnetic member or second iron shims and are unique to the embodiment are attached on both axial ends of the vacuum chamber 11. The iron shims 51 are fixed onto both axial end surfaces 11a of the vacuum chamber 11. On the other hand, the iron shims 52 are fixed onto an outer peripheral surface 11b on both axial ends of the vacuum chamber 11. The iron shims 51 and 52 mainly correct the static magnetic field on both axial ends of a columnar imaging area within the bore.

Gradient magnetic coil structure 20 is fixed onto an inner side of the static magnetic field generating unit 10. The gradient magnetic coil structure 20 is roughly cylindrical. The gradient magnetic coil structure 20 includes a main coil (gradient magnetic coil) 21 and a shield coil 22. The main coil 21 provides a gradient magnetic field on an X axis, a Y axis, and a Z axis. The shield coil 22 cancels a magnetic field leakage from the main coil 21. Shim trays 60 are disposed between the main coil 21 and the shield coil 22. The shim tray 60 is an iron shim supporting structure. Iron shims 71 are stored in the shim tray 60. The iron shims 71 mainly correct the static magnetic field in a middle of the columnar imaging area within the bore. The iron shims 51 and 52, which form the second magnetic member, and iron shims 71, which form a first magnetic member or first iron shims, form a shimming structure unit. The shimming structure unit adjusts static magnetic field uniformity.

The radio frequency coil 30 is fixed onto a uniform magnetic field area side of the gradient magnetic coil structure 20. A patient P lies on the patient couch top 40. The patient couch top 40 is disposed in the uniform magnetic field area and can move in a horizontal direction. The bore has, for example, a patient bore axis length of 1.495 meters and an inner diameter of 65.5 centimeters. A magnet axis length of the static magnetic field generating unit 10 is, for example, 1.400 meters. The radio frequency coil 30 receives a supply of high frequency pulses from the transmitting unit 48 and generates a high frequency magnetic field. The radio frequency coil 30 receives a magnetic resonance signal emitted from the patient P as a result of influence from the high frequency magnetic field.

Although not shown, the transmitting unit 48 includes an oscillating unit, a phase selecting unit, a frequency modulating unit, an amplitude modulating unit, and a high frequency power amplifying unit. The oscillating unit generates a high frequency signal of a resonance frequency unique to a target atomic nucleus within the static magnetic field. The phase selecting unit selects a phase of the high frequency signal. The frequency modulating unit modulates a frequency outputted from the phase selecting unit. The amplitude modulating unit modulates amplitude of the high frequency signal outputted from the frequency modulating unit using, for example, a sinc function. The high frequency power amplifying unit amplifies the high frequency signal outputted from the amplitude modulating unit. As a result of operations performed by the above units, the transmitting unit 48 transmits high frequency pulses corresponding to a Larmor frequency to the radio frequency coil 30.

Although not shown, the receiving unit 49 includes a selector, a front amplifier, a phase detector, and an analog-digital converter. The selector selectively inputs the magnetic resonance signal outputted from the radio frequency coil 30. The front amplifier amplifies the magnetic resonance signal outputted from the selector. The phase detector detects a phase of the magnetic resonance signal outputted from the front amplifier. The analog-digital converter converts the signal outputted from the phase detector to a digital signal.

The operator console 80 includes an interface unit 81, a data collecting unit 82, a reconstructing unit 83, a storage unit 84, a display unit 85, an input unit 86, and a controlling unit 87. The gradient magnetic field power supply 45, the transmitting unit 48, and the receiving unit 49 are connected to the interface unit 81. The interface unit 81 inputs and outputs signals transmitted and received between each connected unit and the operator console 80.

The data collecting unit 82 collects digital signals outputted from the receiving unit 49, via the interface unit 81. The data collecting unit 82 stores the collected digital signals, namely magnetic resonance signal data, in the storage unit 84. The reconstructing unit 83 performs post-processing, namely reconstruction such as Fourier transform, on the magnetic resonance signal data stored in the storage unit 84. The reconstructing unit 83 generates spectrum data or image data of a desired nuclear spin within the patient P.

The storage unit 84 stores the magnetic resonance signal data and the spectrum data or the image data for each patient P. The display unit 85 displays various information items, such as the spectrum data or the image data, under control of the controlling unit 87. A display device such as a liquid crystal display can be used as the display unit 85. The input unit 86 receives various instructions and information input from an operator. The controlling unit 87 performs an overall control of each unit and controls an imaging operation performed by the MRI apparatus.

Figure 2:
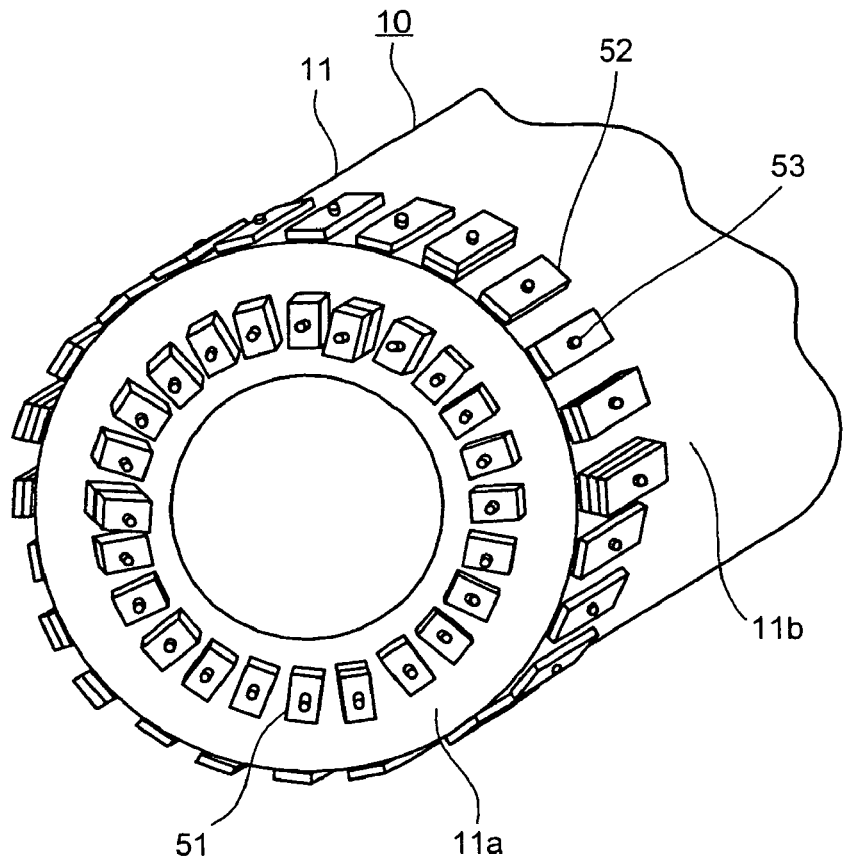
FIG. 2 is a perspective view of iron shims fixed onto one end of a static magnetic field generating unit shown in FIG. 1.
Figure 3:
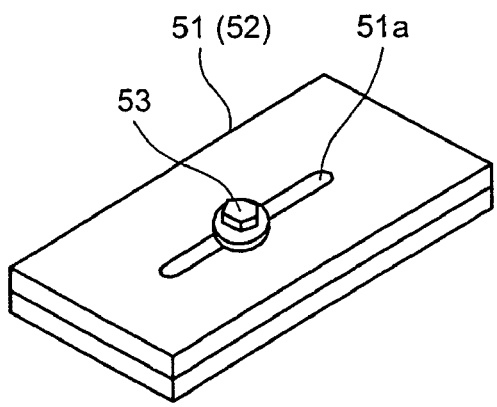
FIG. 3 is an enlarged perspective view of a bundle of two iron shims shown in FIG. 2.
Figure 4:
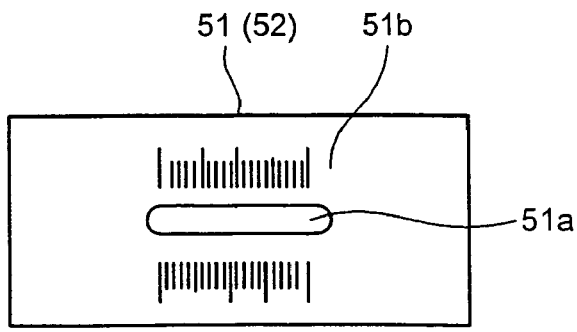
FIG. 4 is a top view of an iron shim shown in FIG. 2.

FIG. 2 is a perspective view of the static magnetic field generating unit 10 to which the iron shims 51 and 52 are fixed. FIG. 3 is an enlarged perspective view of a bundle of two iron shims 51 (or 52). FIG. 4 is a top view of the iron shim 51 (or 52). The iron shims shown in these diagrams are not to the scale, particularly, their thicknesses have been emphasized. The iron shims 51 and 52 have substantially similar shape and they are rectangular plates. A through hole 51a is formed in the center of the iron shim 51 or 52. An anchor bolt 53 passes through the through hole 51a. The iron shim 51 or 52 has, for example, a long side of 50 millimeters, a short side of 40 millimeters, and a thickness of 20 millimeters. A maximum of five iron shims 51 (or 52) can be layered and attached to form a bundle. The through hole 51a is an elongated hole extending in a longitudinal direction such that fine adjustment of an attaching position can be made. Calibration marks 51b are engraved on a top surface of the iron shims 51 and 52, as shown in FIG. 4, to facilitate fine adjustment.

The iron shims 51 and 52 are fixed by the anchor bolt 53 onto a female threaded hole (not shown) formed on the end surface 11a and the outer peripheral surface 11b of the vacuum chamber 11. Twenty-four female threaded holes for fixing the iron shims 51 are formed evenly spaced along a concentric circle at a position near an inner diameter hole of the end surface 11a of the vacuum chamber 11. Twenty-four female threaded holes for fixing the iron shims 52 are formed evenly spaced over an overall circumference of the outer peripheral surface 11b of the vacuum chamber 11 at positions near the end surface 11a. Only a required number of the iron shims 51 and (or 52) are attached to required positions to correct the static magnetic field on both ends of the imaging area. The iron shims 51, 52, and the female threaded holes for attaching the iron shims 51 and 52 are manufactured under strict dimensional control. Iron content of materials forming the iron shims 51 and 52 is also strictly controlled. The static magnetic fields on both axial ends of the imaging area are accurately corrected based on attaching positions and the number of attached iron shims 51 and 52. Because dimension control is difficult, the anchor bolt 53 is made from a non-magnetic material, such as stainless steel, so as not to affect the magnetic field. According to the embodiment, the number of iron shims 51 and 52 having a thickness of 20 millimeters is changed to make adjustments. However, the adjustments can be made by iron shims of different thicknesses being prepared in advance. Appropriate iron shims are selected, and the selected iron shims are attached. The iron shims 51 and 52 are intermittently provided in a circumferential direction. However, adjacent iron shims can be disposed closer together and disposed to form a ring. As a result of the iron shims being disposed to form a ring, further fine adjustments can be made. Moreover, the iron shims 51 and 52 themselves can be made ring-shaped.

Figure 5:
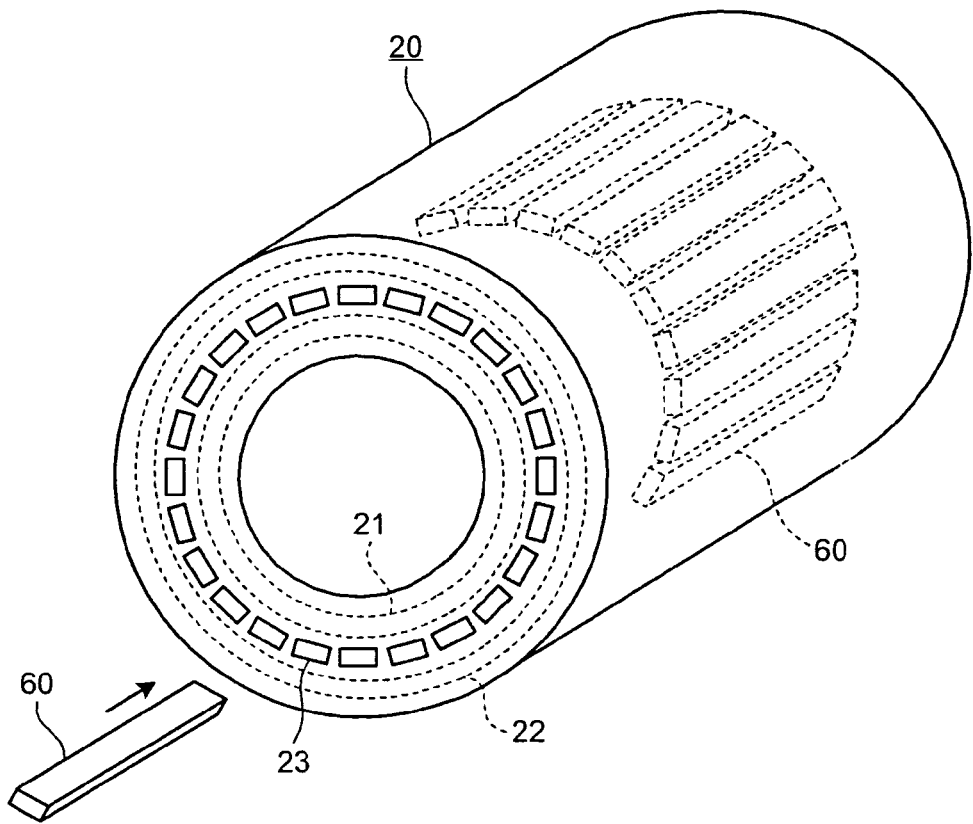
FIG. 5 is a perspective view of a gradient magnetic coil structure shown in FIG. 1.

FIG. 5 is a perspective view of the gradient magnetic coil structure 20. The gradient magnetic coil structure 20 includes the roughly cylindrical main coil 21 and the shield coil 22. For example, twenty-four shim tray insertion guides 23 are formed between the main coil 21 and the shield coil 22. Openings of the shim tray insertion guides 23 are formed on both end surfaces of the gradient magnetic coil structure 20. The openings are through-holes formed over an overall length of the gradient magnetic coil structure 20 in a longitudinal direction. The shim tray insertion guides 23 are formed in parallel and evenly spaced in a circumferential direction in an area between the main coil 21 and the shield coil 22. Twenty-four shim trays 60 are respectively inserted into the shim tray insertion guides 23 and fixed onto a center of the gradient magnetic coil structure 20. The shim trays 60 are made from a non-magnetic and non-conductive resin material. The shim tray 60 is roughly rod-shaped. A length of the shim tray 60 is the same as a length of the gradient magnetic coil structure 20 excluding both ends. In other words, both ends of the shim tray 60 according to the embodiment are shortened by a predetermined length compared to a conventional shim tray.

Figure 6:
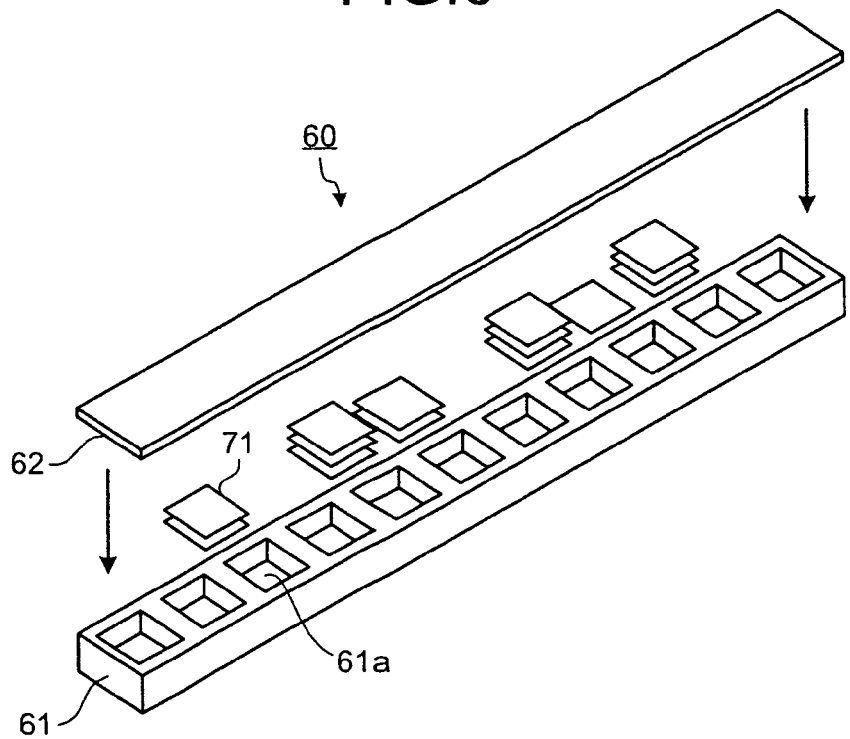
FIG. 6 is a detailed perspective view of a shim tray shown in FIG. 5.
Figure 7:
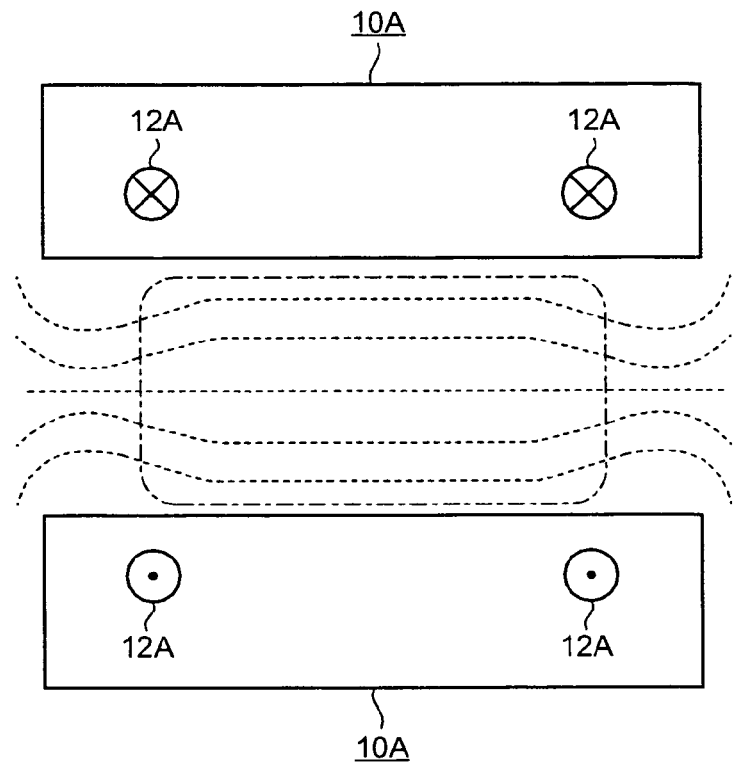
FIG. 7 is a schematic for explaining a static magnetic field generated by a static magnetic field generating unit having a longer axial length.
Figure 8:
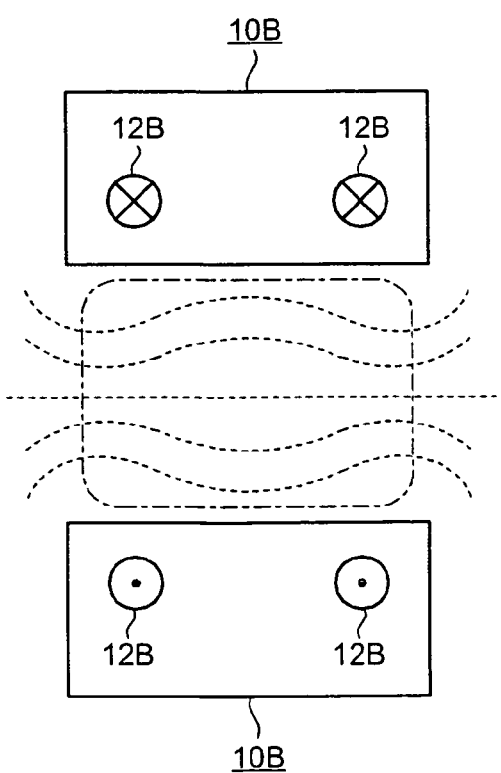
FIG. 8 is a schematic for explaining a static magnetic field generated by a static magnetic field generating unit having a shorter axial length.

FIG. 6 is a detailed perspective view of the shim tray 60. The shim tray 60 includes a tray main body 61 and a cover 62. The tray main body 61 is shaped like a long, narrow box. A plurality of pockets 61a is formed in a series on the tray main body 61 in the longitudinal direction. Only a required number of iron shims 71 are stored in the pockets 61a in required positions to correct the static magnetic field in the middle of the imaging area. Each of the iron shims 71 has, for example, a long side of 40 millimeters, a short side of 30 millimeters, and a thickness of 3 millimeters. A maximum of ten iron shims 71 can be layered. The iron shims 71 and the shim tray 60 are manufactured under strict dimensional control and iron content control. The static magnetic field of an axial center of the imaging area can be accurately corrected based on storage positions of the iron shims 71 and the stored number of iron shims 71.

As described above, iron shims are not arranged on both axial ends of the imaging area within the bore, in which a large number of iron shims had been conventionally required. Instead, the iron shims are arranged on both ends of the static magnetic field generating unit 10 outside of the bore. Because the iron shims are arranged outside of the bore, they are required in even larger numbers, because the iron shims are located away from the magnetic field that is to be corrected. However, the iron shims arranged outside of the bore are not affected by the temperature generated in the gradient magnetic coil structure 20 because the iron shims are located away from the gradient magnetic coil structure 20. Moreover, lesser electromagnetic force works between the gradient magnetic field and the shim trays because there is no iron shim arranged at both ends of the shim trays, where there is a large gradient of the static magnetic field.

As a result of simulations and experiments, it is known that the uniformity of the static magnetic field can be corrected efficiently without influence from the superconductive coil 12 when the static magnetic field generating unit 10 is configured as follows, under conditions according to the embodiment in which the patient bore axis length is 1.495 meters, the inner diameter is 65.5 centimeters, and the magnetic axis length of the static magnetic field generating unit 10 is 1.400 meters. The second iron shims 51, which are fixed onto the end surface 11*a*, are disposed to form a ring with a thickness of several centimeters to 10 centimeters, within a range of 0.7 meters to 0.75 meters in a radial direction from a center axis of the static magnetic field generating unit 10. The second iron shims 52, which are fixed onto the outer peripheral surface 11*b*, are disposed to form a ring with a thickness of several centimeters to 10 centimeters, within a range of 0.99 meters in the radial direction from the center axis of the static magnetic field generating unit 10 and 0.5 meters to 0.7 meters and −0.7 meters to −0.5 meters respectively from both axial ends. The first iron shims 71 are disposed within a range of ±20 centimeters in forward and backward directions from the axial center of the static magnetic field generating unit 10.

As described above, the MRI apparatus 100 according to the embodiment includes the roughly cylindrical static magnetic field generating unit 10 and the shimming structure unit. The static magnetic field generating unit 10 generates the static magnetic field in an internal space. The shimming structure unit adjusts the uniformity of the static magnetic field. The shimming structure unit includes the second iron shims 51 and 52, and the first iron shims 71. The second iron shims 51 and 52 are disposed on the axial end of the static magnetic field generating unit 10 outside of the bore. The first iron shims 71 are disposed in the axial center of the static magnetic field generating unit 10 within the bore. Therefore, the number of iron shims disposed within the bore of the static magnetic field generating unit 10 can be reduced. As a result, the uniformity of the static magnetic field during an MRI operation can be further enhanced. Damage to the iron shim supporting structure, such as the shim tray 60, can be suppressed.

The second iron shims 51 and 52 are fixed onto the end surface 11*a* and the outer peripheral surface 11*b* of the vacuum chamber 11 of the static magnetic field generating unit 10. Therefore, each of the second iron shims 51 and 52 can be firmly fixed with relative ease, using an anchor such as the anchor bolt 53.

Furthermore, the shim trays 60 are disposed in the center of the bore in the static magnetic field generating unit 10. The static magnetic field of the center of the imaging area is corrected as is conventionally done. Therefore, fine adjustments to the static magnetic field can be successfully made.

The iron shims 51 (or 52) are fixed using the anchor bolts 53. However, this is not limited to such anchors. The iron shims 51 (or 52) can be fixed using, for example, an adhesive or the like. The iron shims 51 (or 52) can also be welded after a final adjustment to the static magnetic field is completed.

The iron shims 51 (or 52) are disposed intermittently in the circumferential direction. However, when a uniform magnetic field correction is to be performed in the circumferential direction, an iron shim that is continuous in the circumferential direction, namely a ring-shaped iron shim, can be disposed.

The iron shims 71 are accommodated in the shim tray 60. However, instead, the iron shims 71 can be directly fixed onto the gradient magnetic coil structure 20 through use of anchors or adhesive. The iron shims 71 can also be fixed on to the gradient magnetic coil structure 20 through use of the anchors or adhesive, while being stored in the shim tray 60.

The iron shims 71 are stored in the shim tray 60 that is shorter than the conventional shim tray. However, the iron shims 71 can be stored in a shim tray that has the same length as the conventional shim tray. In this case, the iron shims 71 are not stored on either end of the shim tray.

Figure 9:
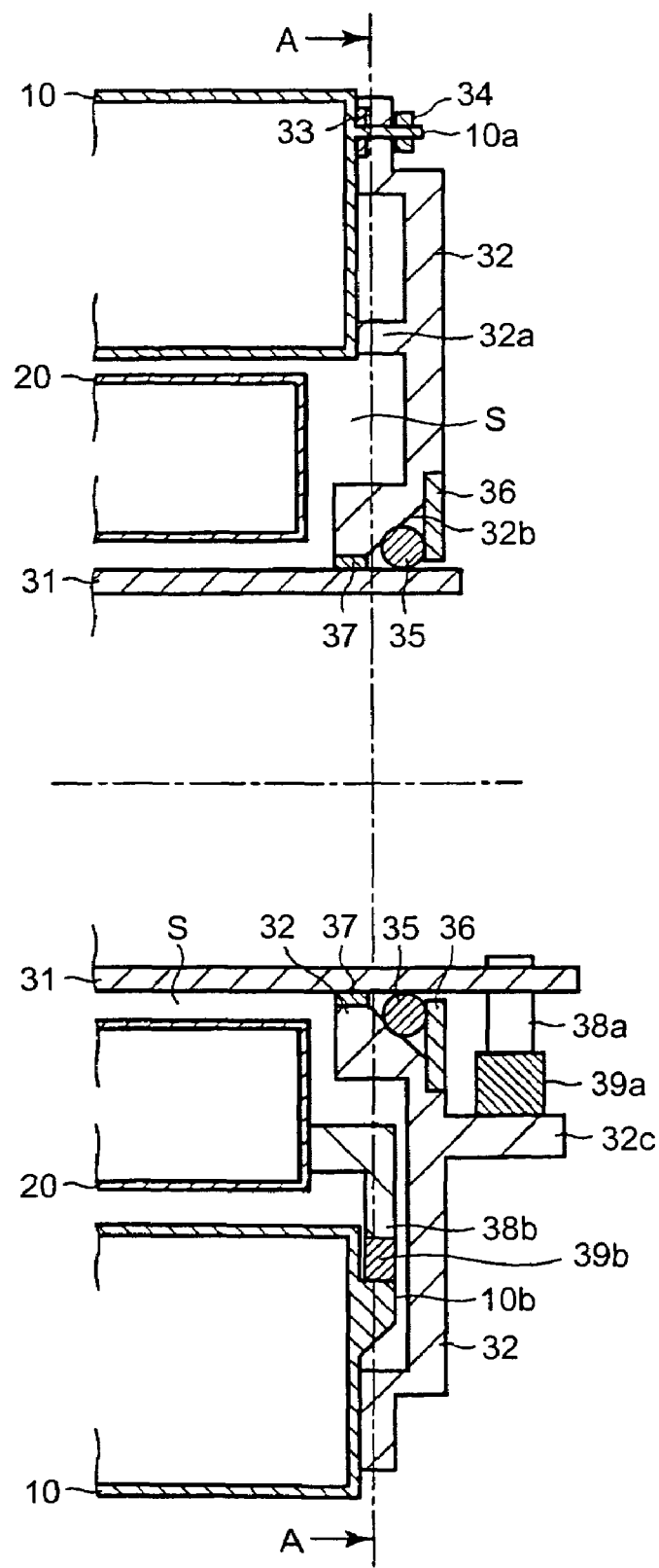
FIG. 9 is a cross-sectional diagram of a side end of the static magnetic field generating unit and the gradient magnetic coil structure and their vicinity when a silencing mechanism is provided.
Figure 10:
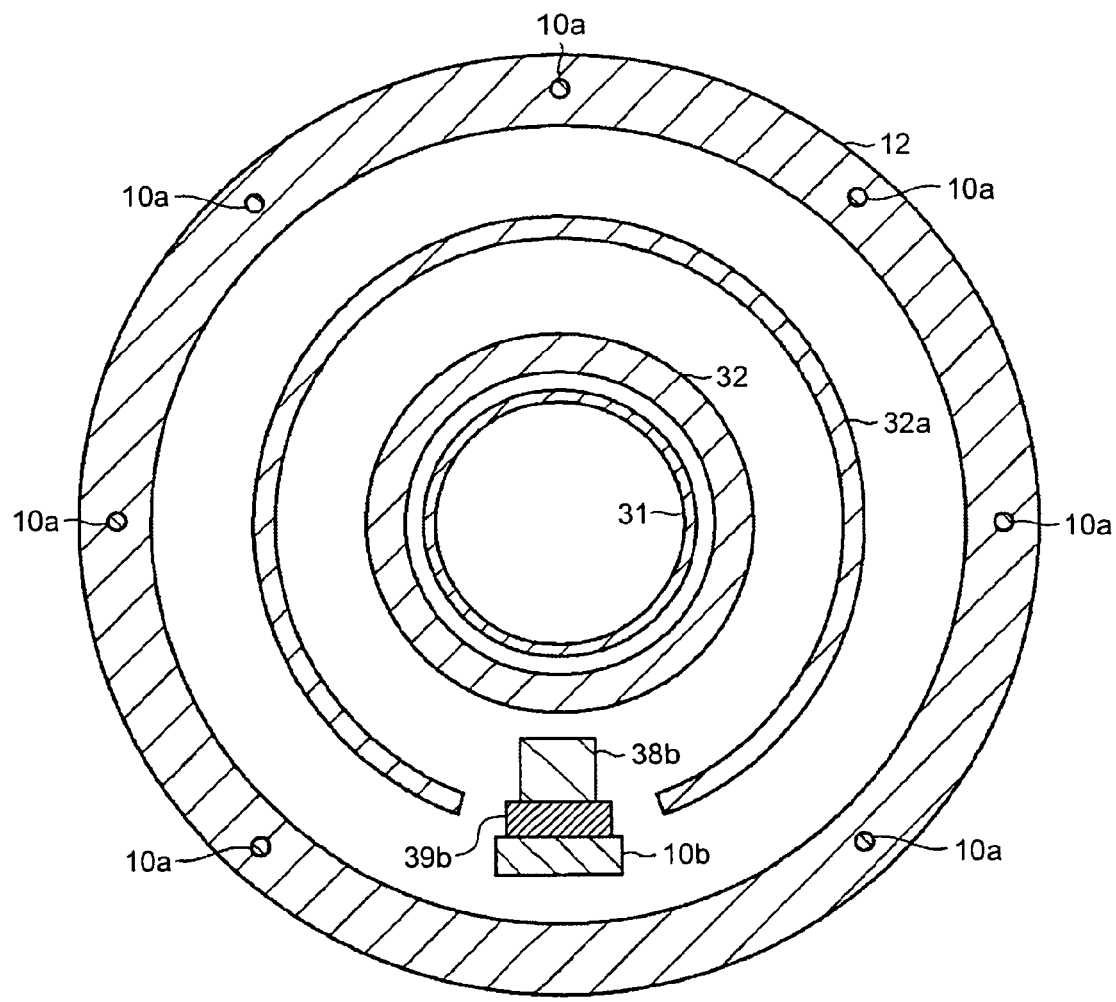
FIG. 10 is a cross-sectional view taken along line A-A in FIG. 9.

According to the embodiment, the gradient magnetic coil structure 20 is not surrounded by a vacuum chamber. However, the gradient magnetic coil structure 20 may be surrounded by a vacuum chamber, serving as a silencing mechanism to suppress noise generated from the gradient magnetic coil structure 20. FIG. 9 is a cross-sectional view of a configuration on side ends of the static magnetic field generating unit 10 and the gradient magnetic coil structure 20 and their vicinity, when the gradient magnetic coil structure 20 is surrounded by a vacuum chamber. The cross-section in FIG. 9 is taken on a vertical plane passing though the center of the static magnetic field. FIG. 10 is a cross-sectional view taken along line A-A in FIG. 9. Only outer frames of the static magnetic field generating unit 10 and the gradient magnetic coil structure 20 are shown.

A bore tube 31 is disposed within the gradient magnetic coil structure 20. The bore tube 31 is cylindrical and hollow. The bore tube 31 prevents the patient P from coming into direct contact with the gradient magnetic coil structure 20.

Near the side ends of the static magnetic field generating unit 10 and the gradient magnetic coil structure 20, a vacuum chamber 32, fixing components 33 and 34, a circular ring 35, a circular ring retainer 36, a damping material 37, a supporting component 38*a*, a damping material 39*a*, and a supporting component 38*b* are provided.

The vacuum chamber 32 is disk-shaped. A circular hole is formed in a center of the vacuum chamber 32. A diameter of the center hole is slightly larger than an outer diameter of the bore tube 31. The bore tube 31 passes through the hole. The vacuum chamber 32 is connected to a fixing axis 10*a* by the fixing component 33 and the fixing component 34, near an outer circumferential border of the vacuum chamber 32. The fixing axis 10*a* is provided in the static magnetic field generating unit 10. An arc-shaped projection 32*a* is formed in the vacuum chamber 32. The projection 32*a* is in contact with the static magnetic field generating unit 10.

A circumferential taper 32*b* is formed on a border facing the hole in the vacuum chamber 32. The taper 32*b* spreads outward. The circular ring 35 is disposed between the taper 32*b* and the bore tube 31. The circular ring retainer 36 holds the circular ring 35 such that the circular ring 35 is in contact with the taper 32*b* and the bore tube 31. The damping material 37 is disposed in an upper portion of the bore tube, in a gap between the vacuum chamber 32 and the bore tube 31.

The supporting component 38*a* is attached beneath the bore tube 31. The supporting component 38*a* supports the bore tube 31 such that the bore tube 31 is in contact with a projection 32*c* provided in the vacuum chamber 32, with the damping material 39*a* therebetween.

The gradient magnetic coil structure 20 is fixed onto a fixing axis 10*b* provided in the static magnetic field generating unit 10, via the supporting component 38b and a damping material 39b. The projection 32a is formed so as not to interfere with the fixing axis 10a.

A space S is formed around the gradient magnetic coil structure 20. The space S is surrounded by the static magnetic field generating unit 10, the bore tube 31, and the vacuum chamber 32. As a result of the space S becoming a vacuum, transmission of the noise generated from the gradient magnetic coil structure 20 to surrounding areas can be prevented.

When the space S is a vacuum, the vacuum chamber 32 is pushed toward the space S, namely in an axial direction, because of air pressure. However, in addition to positions at which the vacuum chamber 32 is fixed onto the static magnetic field generating unit 10, the vacuum chamber 32 is in contact with the static magnetic field generating unit 10 by the projection 32a. Therefore, an axial load from the vacuum chamber 32 can be received by the vacuum chamber 32 itself and the static magnetic field generating unit 10. Therefore, the bore tube 31 is not required to receive the axial load from the vacuum chamber 32. The bore tube 31 and the vacuum chamber 32 are not required to be rigidly connected. As a result, transmission of vibrations from the vacuum chamber 32 to the bore tube 31 can be reduced. The bore tube 31 can be made thinner.

A flexible structure in which the gradient magnetic coil structure 20 and the static magnetic field generating unit 10 are jointed via the damping material 39b prevents the transmission of the vibrations generated by the gradient magnetic coil structure 20 to the static magnetic field generating unit 10. Accordingly, the flexible structure suppresses the noise due to the vibrations of the gradient magnetic coil structure 20. Therefore, in a silencing mechanism point of view, it is important to join the gradient magnetic coil structure 20 and the static magnetic field generating unit 10 using the flexible structure. Moving some of the iron shims 71 out of the shim trays 60 reduces stress working to the shim trays 60 from the iron shims 71, then reduces position change of the gradient magnetic coil structure 20, and, as a result, makes it possible for gradient magnetic field support structure to be more flexible.

The embodiments of the present invention are explained above by using an MRI apparatus. However, technical ideas of the invention can also be advantageously applied to a static magnetic field generating section in an NMR analyzer. The application of the technical ideas is not limited to the MRI apparatus and the NMR analyzer. The technical ideas can be advantageously applied to any apparatus including a static magnetic field generating unit that generates a static magnetic field and a shimming structure that adjusts static magnetic field uniformity using iron shims.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a static magnetic field generating unit that generates a static magnetic field within a bore;
   a gradient magnetic coil that applies a gradient magnetic field to a test subject arranged in the static magnetic field;
   a radio frequency coil that receives a magnetic resonance signal from the test subject to which the gradient magnetic field is applied; and
   a shimming structure unit that adjusts static magnetic field uniformity, wherein the shimming structure unit includes
      a first magnetic member disposed between a main coil and a shield coil of the gradient magnetic coil and disposed in a central axial center of the static magnetic field; and
      a second magnetic member disposed on an outer side of the main coil and the shield coil and disposed on a central axial end of the static magnetic field generating unit.

2. The magnetic resonance imaging apparatus according to claim 1, wherein the second magnetic member is fixed onto an outer peripheral surface of the static magnetic field generating unit.

3. The magnetic resonance imaging apparatus according to claim 1, wherein the second magnetic member is fixed onto an end surface of the static magnetic field generating device.

4. The magnetic resonance imaging apparatus according to claim 1, wherein the static magnetic field generating unit includes a superconducting magnet, and
   the second magnetic member is fixed onto a vacuum chamber of the superconducting magnet.

5. The magnetic resonance imaging apparatus according to claim 2, wherein the static magnetic field generating unit includes a superconducting magnet, and
   the second magnetic member is fixed onto a vacuum chamber of the superconducting magnet.

6. The magnetic resonance imaging apparatus according to claim 3, wherein the static magnetic field generating unit includes a superconducting magnet, and
   the second magnetic member is fixed onto a vacuum chamber of the superconducting magnet.

7. The magnetic resonance imaging apparatus according to claim 4, wherein the second magnetic member includes a plurality of iron shims aligned in a circumferential direction of the vacuum chamber.

8. The magnetic resonance imaging apparatus according to claim 5, wherein the second magnetic member includes a plurality of iron shims aligned in a circumferential direction of the vacuum chamber.

9. The magnetic resonance imaging apparatus according to claim 6, wherein the second magnetic member includes a plurality of iron shims aligned in a circumferential direction of the vacuum chamber.

10. The magnetic resonance imaging apparatus according to claim 4, wherein the second magnetic member is an iron ring running along a cylindrical shape of the vacuum chamber.

11. The magnetic resonance imaging apparatus according to claim 5, wherein the second magnetic member is an iron ring running along a cylindrical shape of the vacuum chamber.

12. The magnetic resonance imaging apparatus according to claim 6, wherein the second magnetic member is an iron ring running along a cylindrical shape of the vacuum chamber.

13. The magnetic resonance imaging apparatus according to claim 4, wherein the second magnetic member is fixed onto the vacuum chamber with a non-magnetic anchor bolt.

14. The magnetic resonance imaging apparatus according to claim 5, wherein the second magnetic member is fixed onto the vacuum chamber with a non-magnetic anchor bolt.

15. The magnetic resonance imaging apparatus according to claim 6, wherein the second magnetic member is fixed onto the vacuum chamber with a non-magnetic anchor bolt.

16. The magnetic resonance imaging apparatus according to claim 1, wherein the first magnetic member includes a plurality of iron shims and trays that accommodates the iron shims, and the first magnetic member is arranged within the bore in the static magnetic field generating unit.

17. The magnetic resonance imaging apparatus according to claim 2, wherein the first magnetic member includes a plurality of iron shims and trays that accommodates the iron shims, and the first magnetic member is arranged within the bore in the static magnetic field generating unit.

18. The magnetic resonance imaging apparatus according to claim 3, wherein the first magnetic member includes a plurality of iron shims and trays that accommodates the iron shims, and the first magnetic member is arranged within the bore in the static magnetic field generating unit.

19. The magnetic resonance imaging apparatus according to claim 1, wherein the first magnetic member is attached to the gradient magnetic coil provided within the bore in the static magnetic field generating unit.

20. The magnetic resonance imaging apparatus according to claim 2, wherein the first magnetic member is attached to the gradient magnetic coil provided within the bore in the static magnetic field generating unit.

21. The magnetic resonance imaging apparatus according to claim 1, wherein the second magnetic member is fixed within a range of 0.7 meters to 0.75 meters in a radial direction from a center axis of the static magnetic field generating unit.

22. The magnetic resonance imaging apparatus according to claim 1, wherein the first magnetic member is fixed within a range of 20 centimeters in forward and backward directions from an axial center of the static magnetic field generating unit.

23. The magnetic resonance imaging apparatus according to claim 1, further comprising a structure that flexibly holds the gradient magnetic coil to serve as a silencing mechanism for suppressing noise generated by the gradient magnetic coil.

24. A nuclear magnetic resonance analyzer comprising:
a static magnetic field generating unit that generates a static magnetic field within a bore;
a gradient magnetic coil that applies a gradient magnetic field to a sample for analysis arranged in the static magnetic field;
a radio frequency coil that receives a magnetic resonance signal from the sample to which the gradient magnetic field is applied; and
a shimming structure unit that adjusts static magnetic field uniformity, wherein the shimming structure unit includes
a first magnetic member disposed between a main coil and a shield coil of the gradient magnetic coil and disposed in a central axial center of the static magnetic field; and
a second magnetic member disposed on an outer side of the main coil and the shield coil and disposed on a central axial end of the static magnetic field generating unit.

25. A gantry comprising:
a static magnetic field generating unit that generates a static magnetic field within a bore; and
a shimming structure unit that adjusts static magnetic field uniformity, wherein the shimming structure unit includes
a first magnetic member disposed between a main coil and a shield coil of a gradient magnetic coil, which applies a gradient magnetic field to a test subject or a sample for analysis arranged in the static magnetic field, and disposed in a central axial center of the static magnetic field; and
a second magnetic member disposed on an outer side of the main coil and the shield coil and disposed on a central axial end of the static magnetic field generating unit.

* * * * *